United States Patent [19]

Salotti et al.

[11] 4,179,839

[45] Dec. 25, 1979

[54] DEVICE FOR KEEPING UNDER CONTROL THE POPULATION OF SELECTED SPECIES OF INSECTS

[75] Inventors: Gianfranco Salotti, Avigliana; Elvio Ferrero; Franco Grisotto, both of Turin, all of Italy

[73] Assignee: Fiat Societa per Azioni, Turin, Italy

[21] Appl. No.: 895,554

[22] Filed: Apr. 12, 1978

[30] Foreign Application Priority Data

Apr. 12, 1977 [IT] Italy ................. 67800 A/77

[51] Int. Cl.² ............... A01M 1/22; G07C 11/00
[52] U.S. Cl. ................... 43/112; 43/98; 235/92 MS
[58] Field of Search ........... 43/112, 98, 99; 235/92 MS, 92 TC

[56] References Cited

U.S. PATENT DOCUMENTS

| | | | |
|---|---|---|---|
| 1,001,400 | 8/1911 | Hertzberg et al. | 43/99 |
| 1,823,892 | 9/1931 | Galbraith | 43/112 |
| 3,040,980 | 6/1962 | Mann et al. | 235/92 MS |
| 3,796,864 | 3/1974 | Sampey | 235/92 TC |
| 3,827,176 | 8/1974 | Stirewalt | 43/98 |
| 4,037,351 | 7/1977 | Springer | 43/112 |
| 4,048,746 | 9/1977 | Dye | 43/98 |

*Primary Examiner*—Nicholas P. Godici
*Assistant Examiner*—K. Bradford Adolphson
*Attorney, Agent, or Firm*—Sughrue, Rothwell, Mion, Zinn and Macpeak

[57] ABSTRACT

An apparatus for use in monitoring the numbers of a selected species of insect comprises one or more traps into which is put a synthesized pheromone to attract that particular insect. Each trap has a grille comprising a plurality of bars between which is applied a high voltage so that when an insect of the selected species tries to enter the trap it touches adjacent bars and is electrocuted by the electric discharge between them. This discharge is detected by a discharge detector connected to the trap and the detector passes a signal to a transmitter which transmits it to a central receiver equipped with a discriminator for ignoring signals other than those from the transmitter and for passing the signals representing discharges to a pulse counter whereby a total of the number of insects trapped in a given time can be obtained at a central station without visiting each trap.

4 Claims, 1 Drawing Figure

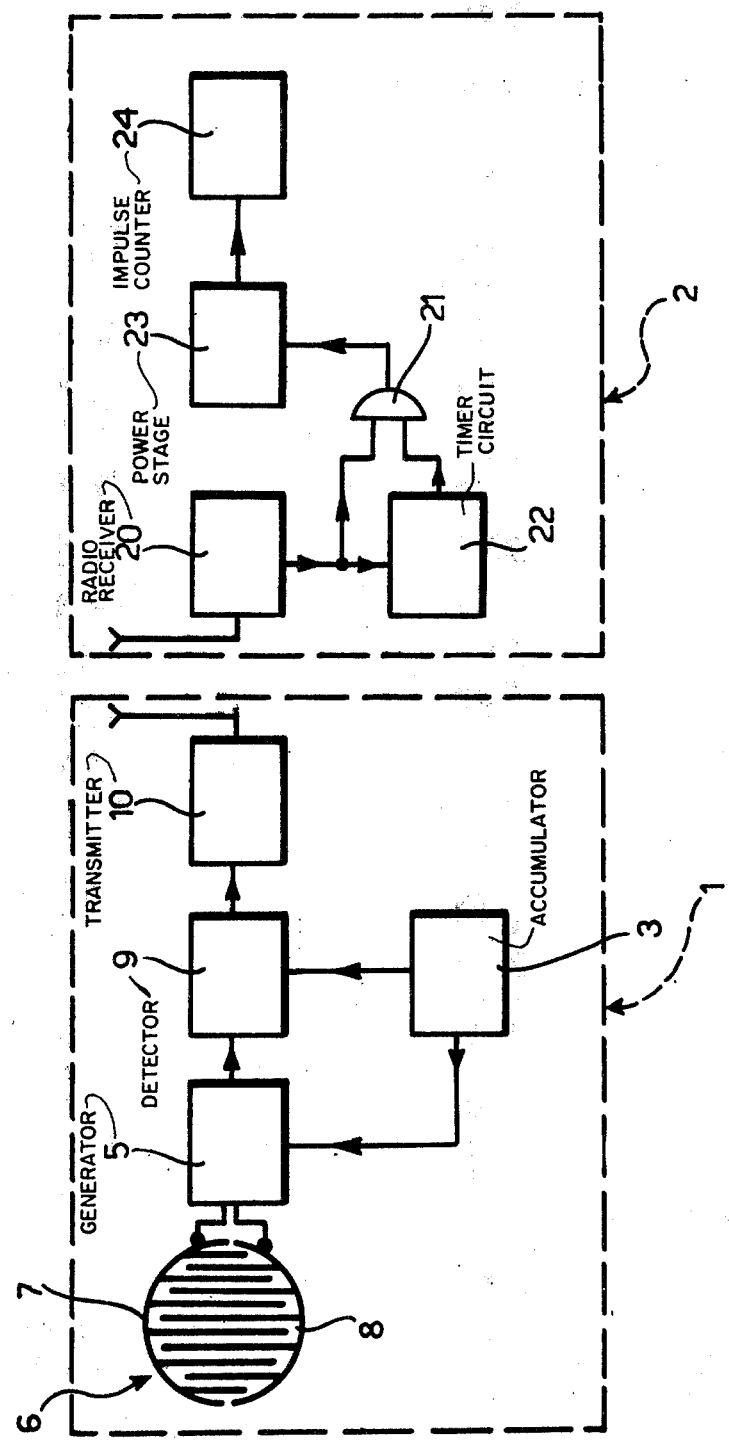

DEVICE FOR KEEPING UNDER CONTROL THE POPULATION OF SELECTED SPECIES OF INSECTS

BACKGROUND OF THE INVENTION

1. Field of the Invention

The present invention relates to a device for use in connection with the control of insects, in particular for monitoring the population of selected species of insects.

2. Prior Art

In order to be able to protect crops adequately it is necessary to be able to determine exactly when any given species of insect begins to pose a threat to them so that measures can be taken to reduce the infestation of that insect, for example, by spraying an appropriate insecticide.

It is important that spraying should take place in good time. Late spraying would not obtain the required results and therefore the usual procedure is to spray as soon as it seems even likely that a rapid proliferation of harmful insects is about to take place. This procedure is not satisfactory, however, since it is expensive and often wasteful inasmuch as spraying sometimes takes place when it is not necessary; it is also unsatisfactory inasmuch as indiscriminate spraying causes a considerable degrading of the environment.

Attempts have been made to avoid these disadvantages by using insect traps which enable a reasonably accurate estimation of the insect population to be made. One known such trap comprises a sheet of thin card on which is placed a synthesised substance, that is pheromone, which in nature is secreted from the female insect in order to attract the males; the synthesised pheromone could be, for example, one of the types produced by the firm Zoecon under the trade names Codlemone, Orfamone and Funemone. The male insect, attracted by the pheromone, lands on the card and remains trapped there by a sticky substance which covers the bottom of the trap. When using this system the farmer must inspect the various traps daily and count those insects of the type with which he is concerned trapped on the card, in order to be able to establish, on the basis of the number of insects caught, and by means of very precise tables, whether the population of the species under examination is rapidly increasing, and therefore whether it is necessary to take any steps to control the proliferation of this insect.

This system has a number of disadvantages; the traps are exposed to all weathers and therefore their efficiency deteriorates; moreover, the farmer has to count, every day without fail, the number of insects caught in each trap, and then has to remove them from the trap with special tweezers, and record the number of insects and the day on which they were trapped so as to be able to monitor changes in the population of these insects.

Clearly all this requires great care and attention, and moreover it constitutes a loss of useful time. The present invention seeks to avoid the above mentioned disadvantages with a device for use in controlling the population of selected species of insects, which is easy to manufacture, of low cost, will not deteriorate significantly under the action of atmospheric agents, and by means of which the number of trapped insects can be counted automatically.

SUMMARY OF THE INVENTION

According to the present invention there is provided a device for use in keeping insect infestations under control, including at least one trap provided with electrical conductor means connected across a high tension generator and operable to produce an electrical discharge when an insect above a given size comes into contact therewith; a discharge detector operable to detect such electrical discharge and to enable, in response thereto, operation of a radio transmitter whereby to transmit a signal to a radio receiver the output of which is fed to an impulse counter which counts each time the transmitter is operated, to provide an indication, at a location remote from the trap, of the number of insects trapped thereby.

BRIEF DESCRIPTION OF THE DRAWINGS

The invention will now be more particularly described, by way of example, with reference to the accompanying drawing, which is a block schematic diagram of a device according to the present invention.

DETAILED DESCRIPTION OF THE INVENTION

The device shown in the FIGURE comprises two main units, a detector and transmitter unit 1, and a receiver and indicator unit 2. The detector and transmitter unit 1 comprises an electrical accumulator 3 (which may conveniently be a commonly available 6 or 12 volt type) which feeds a high tension generator 5. The high tension generator 5 5 produces a low power high voltage of the order of, for example, 3,000 to 4,000 volts.

To the two terminals of the high tension generator 5 are connected respective sets of interlaced parallel bars 7, 8 constituting a grille covering an opening to a trap 6 the interior of which contains pheromone in use of the device. The two sets of bars 7, 8 are disposed in such a way that an insect of the selected species, in order to enter the trap, must necessarily touch two adjacent bars whilst trying to enter, and since the two sets of bars 7, 8 are electrically connected to the high tension generator 5 the potential difference across them is more than sufficient to electrocute the insect.

The high tension generator 5 is also connected to an electronic discharge detector 9, which is connected to the accumulator 3 and to a radio transmitter 10. In operation of the device the accumulator 3 always feeds a low tension current to the high tension generator 5 and to the discharge detector 9. The discharge detector 9 feeds the low tension current received from the accumulator 3 to the radio transmitter 10 each time an insect contacts the grille 7, 8 and causes a discharge, so that the radio transmitter 10 operates to transmit a signal each time an insect tries to enter the trap 6. The radio transmitter may be, for example, an amplitude modulation type, such as the transmitter made and sold by the firm G.B.C. Amtromcraft under the reference U.K. 302.

A radio receiver 20, for example a U.K. 345 made by G.B.C. Amtromcraft, receives the signal transmitted by the transmitter 10, and the output signal from the receiver 20 is fed both to a logic AND gate 21 and a timer circuit 22. The output signal generated by the radio receiver 20 can pass the AND gate 21 only if its duration is greater than a predetermined time (for example five seconds) determined by the timer 22. This thus ensures that disturbance signals, such as those due to lightning or other electrical discharges, or to electromagnetic radiation can be distinguished from the signal from the transmitter 10.

The signal generated by the receiver 20, after having passed the gate 21, is amplified by a power stage 23, and is then fed to an impulse counter 24 so that, for each discharge of the high tension generators, the counter 24 increments by one unit.

The receiver and indicator unit 2 can be located at any convenient position, for example in the farmhouse, for observation by the farmer, who can therefore be continuously informed of the number of insects being caught and can decide on the basis of this, in good time when intervention to reduce the infestation of insects is necessary.

What is claimed is:

1. A device for use in keeping insect infestations under control, said device comprising:
   at least one trap,
   electrical conductor means on said at least one trap,
   a high tension generator,
   said electrical conductor means being connected across the output of said high tension generator and being so formed as to produce an electrical discharge when an insect above a given size comes into contact with the said electrical conductor means,
   radio transmitter means,
   discharge detector means operable to detect electrical discharges across said electrical conductor means and to enable, in response thereto operation of said radio transmitter means,
   radio receiver means for receiving signals transmitted by said radio transmitter means, and
   an impulse counter means connected to the output of said radio receiver means, said impulse counter means operating to count each time said transmitter means is operated, whereby to provide an indication, at a location remote from said trap, of the number of insects trapped thereby.

2. The device of claim 1, wherein there is provided a discriminator device connected between said radio receiver and said impulse counter, said discriminator device comprising:
   a timer circuit the input of which is connected directly to the output of said radio receiver, and
   a gating device connected to the output of said radio receiver and to the output of said timer circuit, said gating device operating to pass the output signal from said radio receiver to said impulse counter only if the duration of said output signal is longer than a time determined by said timer circuit.

3. The device of claim 2, wherein said gating device is a logic AND gate.

4. The device of claim 1, wherein said at least one trap is constituted by a casing having at least one access opening; said at least one access opening being protected by a grille of parallel bars, adjacent bars being connected electrically to opposite terminals of said high tension generator and constituting said electrical conductor means.

* * * * *